(12) United States Patent
Wong et al.

(10) Patent No.: US 6,414,868 B1
(45) Date of Patent: *Jul. 2, 2002

(54) MEMORY EXPANSION MODULE INCLUDING MULTIPLE MEMORY BANKS AND A BANK CONTROL CIRCUIT

(75) Inventors: Tayung Wong, Fremont; John Carrillo, San Jose; Jay Robinson, Sunnyvale; Clement Fang, Cupertino, all of CA (US)

(73) Assignee: Sun Microsystems, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,058

(22) Filed: Jun. 7, 1999

(51) Int. Cl.$^7$ .................................................. G11C 5/02
(52) U.S. Cl. ..................... 365/51; 365/193; 365/230.03
(58) Field of Search ............................. 365/51, 52, 63, 365/230.03, 193, 189.01, 230.01, 222; 711/5, 1

(56) References Cited

U.S. PATENT DOCUMENTS

| | | |
|---|---|---|
| 4,025,903 A | 5/1977 | Kaufman et al. |
| 4,630,230 A | 12/1986 | Sundet |
| 5,228,132 A | 7/1993 | Neal et al. |
| 5,260,892 A | 11/1993 | Testa |
| 5,265,218 A | 11/1993 | Testa et al. |
| 5,270,964 A | 12/1993 | Bechtolsheim et al. |
| 5,272,664 A | 12/1993 | Alexander et al. |
| 5,339,269 A | 8/1994 | Takagi |
| 5,504,700 A | 4/1996 | Insley et al. |
| 5,522,064 A | 5/1996 | Aldereguia |
| 5,686,730 A | 11/1997 | Laudon et al. |
| 5,745,914 A * | 4/1998 | Connolly et al. ............ 711/105 |
| 5,771,199 A | 6/1998 | Lee |
| 5,961,660 A * | 10/1999 | Capps, Jr. et al. .......... 714/763 |
| 6,038,132 A | 3/2000 | Tokunaga et al. |

FOREIGN PATENT DOCUMENTS

| | | |
|---|---|---|
| EP | 0 744 748 | 11/1996 |
| EP | 0 813 204 | 12/1997 |

OTHER PUBLICATIONS

PNY Technologies, "2M x32 Bit 5V EDO SIMM; Extended Data Out (EDO) DRAM SIMM", 1996.

* cited by examiner

*Primary Examiner*—Hoai V. Ho
(74) *Attorney, Agent, or Firm*—Conley, Rose & Tayon, PC; B. Noël Kivlin

(57) ABSTRACT

A memory expansion module including multiple memory banks and a bank control circuit is disclosed. In one embodiment, a memory module includes a printed circuit board with a connector edge adapted for insertion in an expansion socket of a computer system. Mounted upon the circuit board is a plurality of memory chips, typically Dynamic Random Access Memory (DRAM) chips, which make up an upper bank and a lower bank of memory. A buffer circuit is mounted upon the printed circuit board, for the purpose of driving address signals, Column Address Strobe (CAS) signals, and write enable signals to each of the memory chips. Also mounted upon the printed circuit board is a bank control circuit, which is coupled to the memory chips. An address signal is used as a bank selection input to the bank control circuit, which will drive Row Address Strobe (RAS) signals to the memory chips of the selected memory bank. The bank control circuit is further configured to drive RAS signals to both banks simultaneously during CBR (CAS before RAS) refresh operations, which occur when a CAS signal is asserted before a RAS signal.

12 Claims, 7 Drawing Sheets

Fig. 3

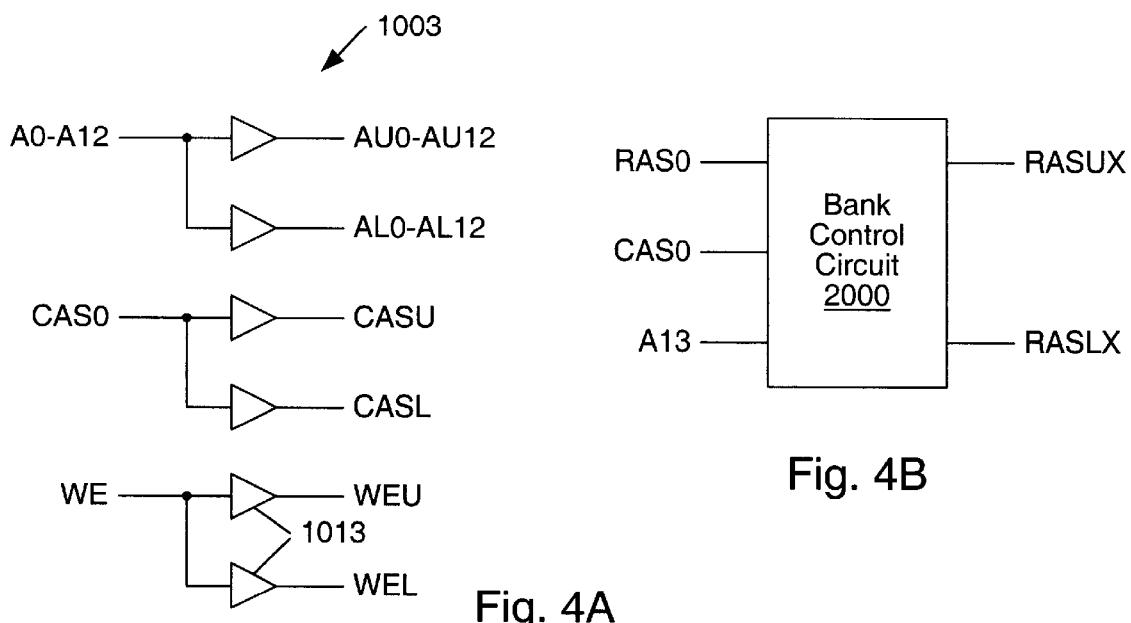
Fig. 4A
Fig. 4B
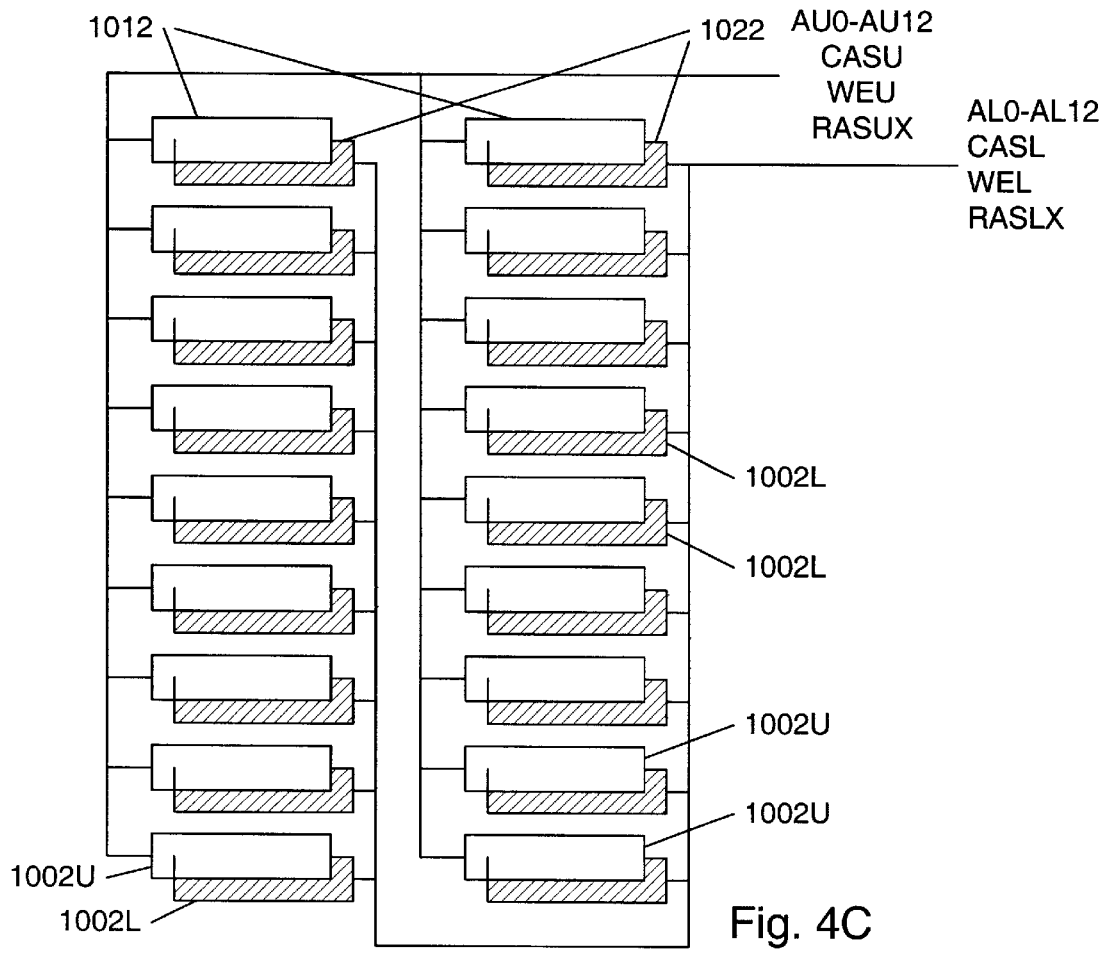
Fig. 4C

| A13 | RAS | CAS | RASU @ STATE N | RASL @ STATE N | RASU @ STATE N+1 | RASL @ STATE N+1 |
|---|---|---|---|---|---|---|
| 0 | 0 | 1 | 0 | 0 | 0 | 1 |
| 1 | 0 | 1 | 0 | 0 | 1 | 0 |
| 0 | 0 | 0 | 0 | 1 | 0 | 0 |
| 1 | 0 | 0 | 1 | 0 | 0 | 0 |
| X | 0 | 0 | 0 | 0 | 0 | 0 |
| X | 1 | 0 | 0 | 0 | 1 | 1 |
| X | 1 | X | 1 | 1 | 1 | 1 |
| X | 0 | X | 1 | 1 | 0 | 0 |

MEMORY EXPANSION MODULE INCLUDING MULTIPLE MEMORY BANKS AND A BANK CONTROL CIRCUIT

BACKGROUND OF THE INVENTION

1. Field of the Invention

This invention generally relates to memory hardware for computer systems, and more specifically to memory expansion modules for expanding memory in computer systems.

2. Description of the Relevant Art

Many modern computer systems allow for memory expansion by way of single inline memory modules (SIMMs) and/or dual inline memory modules (DIMMs). SIMMs and DIMMs include small, compact circuit boards that are designed to mount easily into an expansion socket mounted on another circuit board, typically a computer motherboard. The circuit boards used to implement SIMMs and DIMMs include an edge connector comprising a plurality of contact pads, with contact pads typically being present on both sides of the circuit board. On SIMMs, opposing contact pads are connected together (i.e. shorted), and thus carry the same signal, while at least some opposing contact pads on DIMMs are not connected, and thus allowing different signals to be carried. Due to this, higher signal density may be accommodated by DIMMs.

Memory elements mounted on SIMMs and DIMMs are typically Dynamic Random Access Memory (DRAM) chips. DRAM chips store information as a charge on a capacitor, with the charge level representing a logic one or logic zero. Since a capacitor charge will dissipate over time, DRAM chips require refresh cycles on a periodic basis.

To access a location in a DRAM, an address must first be applied to the address inputs. This address is then decoded, and data from the given address is accessed. In modern DRAMs, rows and columns are addressed separately using row address strobe (RAS) and column address strobe (CAS) control signals. By using RAS and CAS signals, row and column addresses can be time-multiplexed on common signal lines, contact pads, and pins of the address bus. This allows a greater number of memory locations that can be addressed without a corresponding increase in the number of required signal lines, contact pads, and pins.

To address a memory location in a DRAM as described above, a RAS signal is asserted on the RAS input of the DRAM, and a row address is forwarded to row decode logic on a memory chip. The contents of all locations in the addressed row will then be sent to a column decoder, which is typically a combination multiplexer/demultiplexer. After row addressing is complete, a CAS signal is asserted, and a column address is sent to the column decoder. The multiplexer in the column decoder will then select the corresponding column from the addressed row, and the data from that specific row/column address is placed on the data bus for used by the computer system.

Although the RAS and CAS signals allow the time-multiplexing of address signals, total memory capacity in a system may be limited by the number of address inputs on the memory chips employed in the system. This is true even if the system address bus is wider than the number of address inputs for an individual memory chip. The use of memory chips with a greater number of address inputs, and hence higher capacity, may disproportionately increase the cost of the desired memory expansion. It would be desirable to increase the memory capacity for such a computer system by adding extra banks of memory without having to change the type of memory chip employed. However, the number of address inputs to the system's memory chips limits the ability to do this. Furthermore, the presence of only one RAS and one CAS signal also limits the ability to expand system memory, as a separate bank of memory typically requires at minimum either a unique RAS or unique CAS signal for each bank. As such, it would be desirable to overcome the limitations described above in order to allow extra banks of memory to be added to a computer system, thereby expanding system memory capacity.

SUMMARY OF THE INVENTION

The problems outlined above may in large part be solved by a memory expansion module including multiple memory banks and a bank control circuit in accordance with the present invention. In one embodiment, a memory module includes a printed circuit board with a connector edge adapted for insertion in an expansion socket of a computer system. Mounted upon the circuit board is a plurality of memory chips, typically Dynamic Random Access Memory (DRAM) chips, which make up an upper bank and a lower bank of memory. A buffer circuit is mounted upon the printed circuit board, for the purpose of driving address signals, Column Address Strobe (CAS) signals, and write enable signals to each of the memory chips. Also mounted on the printed circuit board is a bank control circuit, which is coupled to the memory chips. An address signal is used as a bank selection input to the bank control circuit, which will drive Row Address Strobe (RAS) signals to the memory chips of the selected memory bank. The bank control circuit is further configured to drive RAS signals to both banks simultaneously during CBR (CAS before RAS) refresh operations, which occur when a CAS signal is asserted before a RAS signal. By using the bank control circuit to enable the addition of a second memory bank, a memory expansion can be realized without the need for higher capacity memory chips, which may result in an advantageous cost savings.

In one embodiment of the invention, a Dual Inline Memory Module (DIMM) employs a bank control circuit for bank selection. In this embodiment, the bank control circuit is a programmable logic device (PLD), although this circuit may be implemented in other forms for different embodiments. The bank control circuit receives a RAS signal, a CAS signal, and the selected address bit from expansion socket of a computer system. The bank control circuit drives multiple RAS signals. When the bank control circuit is in an idle state, receiving a RAS signal will cause a memory access operation to begin. The bank of memory to be selected will depend on the logic level of the address input to the bank control circuit. The bank control circuit will then drive RAS signals to the selected memory bank, allowing a row address to be selected. When the memory chips of the selected bank receive a CAS signal, the column address is selected, and the requested memory address is accessed.

If, when in an idle state, the bank control circuit receives a CAS signal, a CBR refresh cycle is begun. The CAS signal is received by both the bank control circuit and a buffer circuit, which drives CAS signals to each of the memory chips. Following this, a RAS signal is received by the bank control circuit, which then drives RAS signals to each of the DRAM chips of the memory module, and the CBR refresh is performed. When both the CAS and RAS inputs to the memory module are deasserted, the bank control circuit returns to an idle state.

Thus, in various embodiments, the memory expansion module with multiple memory banks and a bank control circuit advantageously allows greater memory capacity by accommodating multiple memory banks. Additionally, memory capacity can be increased without requiring the use of memory chips with a higher address width.

BRIEF DESCRIPTION OF THE DRAWINGS

Other objects and advantages of the invention will become apparent upon reading the following detailed description and upon reference to the accompanying drawings in which:

FIG. 4A is a schematic illustrating an embodiment of the line driver chip;

FIG. 4B is a drawing illustrating an embodiment of the bank control circuit;

FIG. 4C is a block diagram illustrating the upper and lower banks of memory with associated control signal connections;

FIG. 6 is a truth table that illustrates some of the state transitions of the bank control circuit in FIG. 5;

Figure 1:
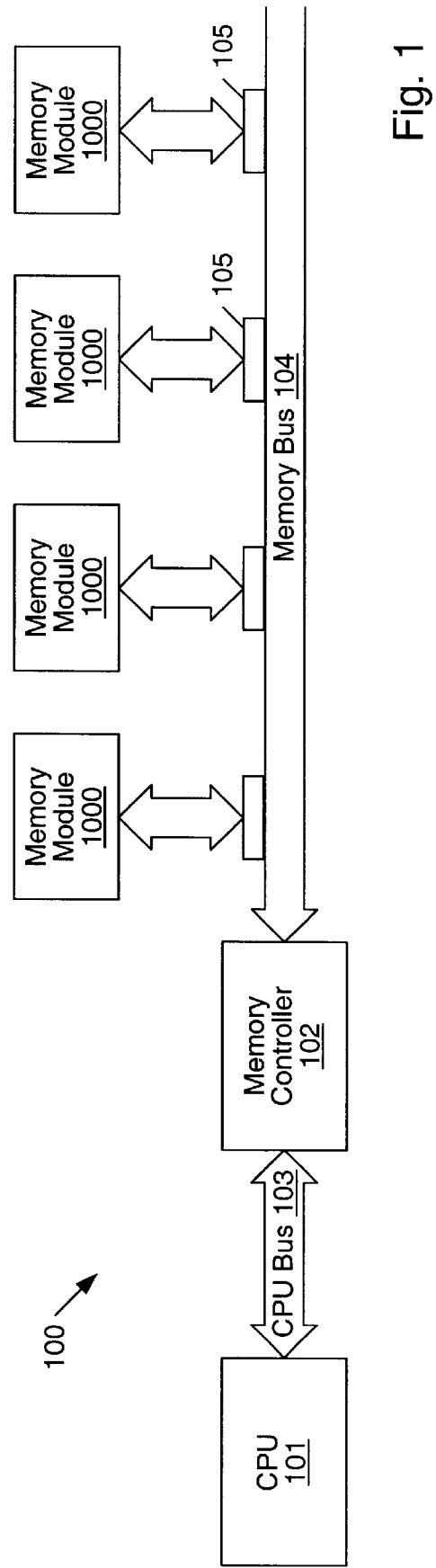
FIG. 1 is a block diagram illustrating a computer system having a CPU, a memory controller, a CPU bus, and a plurality of memory modules in one embodiment of the invention.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scoped of the present invention as defined be the appended claims.

DETAILED DESCRIPTION OF THE INVENTION

Referring now to FIG. 1, a computer system 100 employing one embodiment of memory modules 1000, as will be described below, is shown. The computer system includes a CPU 101, coupled to a memory controller 102 through a CPU bus 103. The memory controller 102 is coupled to each of the memory modules 1000 through a memory bus 104. In this embodiment, the memory modules are provided to expand main memory of computer system 100, and are coupled to memory bus 104 through a set of expansion sockets 105.

Figure 2:
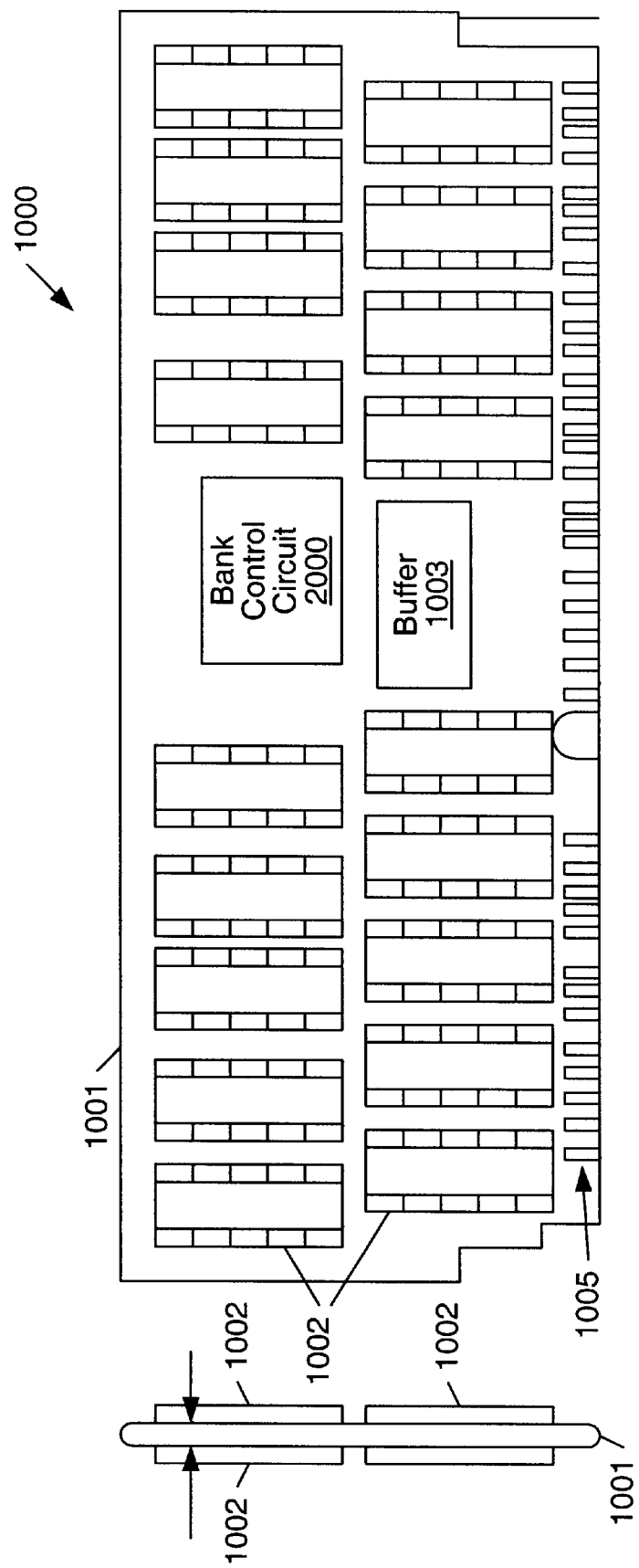
FIG. 2 is a diagram illustrating components associated with an embodiment of a memory module.

Turning now to FIG. 2, a diagram illustrating components associated with a memory module 1000 is shown. In this particular embodiment, a plurality of memory elements 1002, typically DRAM (Dynamic Random Access Memory) chips, are surface mounted upon a printed circuit board (PCB) 1001. On one edge of the printed circuit board is an edge connector 1005, which includes a plurality of electrical contact pads. These contact pads electrically couple memory module 1000 to the memory bus 104 by mating with a corresponding expansion socket 105 shown in FIG. 1. Signals passing through the edge connector include data signals, address signals, and control signals. In one embodiment, at least some of the opposing electrical contact pads of edge connector 1005 are not connected (i.e. shorted), thus making the embodiment a Dual Inline Memory Module (DIMM).

Also mounted on PCB 1001 are a buffer chip 1003 (which can also be referred to as a line driver) and a bank control circuit 2000. Buffer chip 1003 may be used to provide additional fan-out capability for control signals, address signals, and data signals. A bank control circuit 2000 is also mounted upon PCB 1001.

Figure 3:
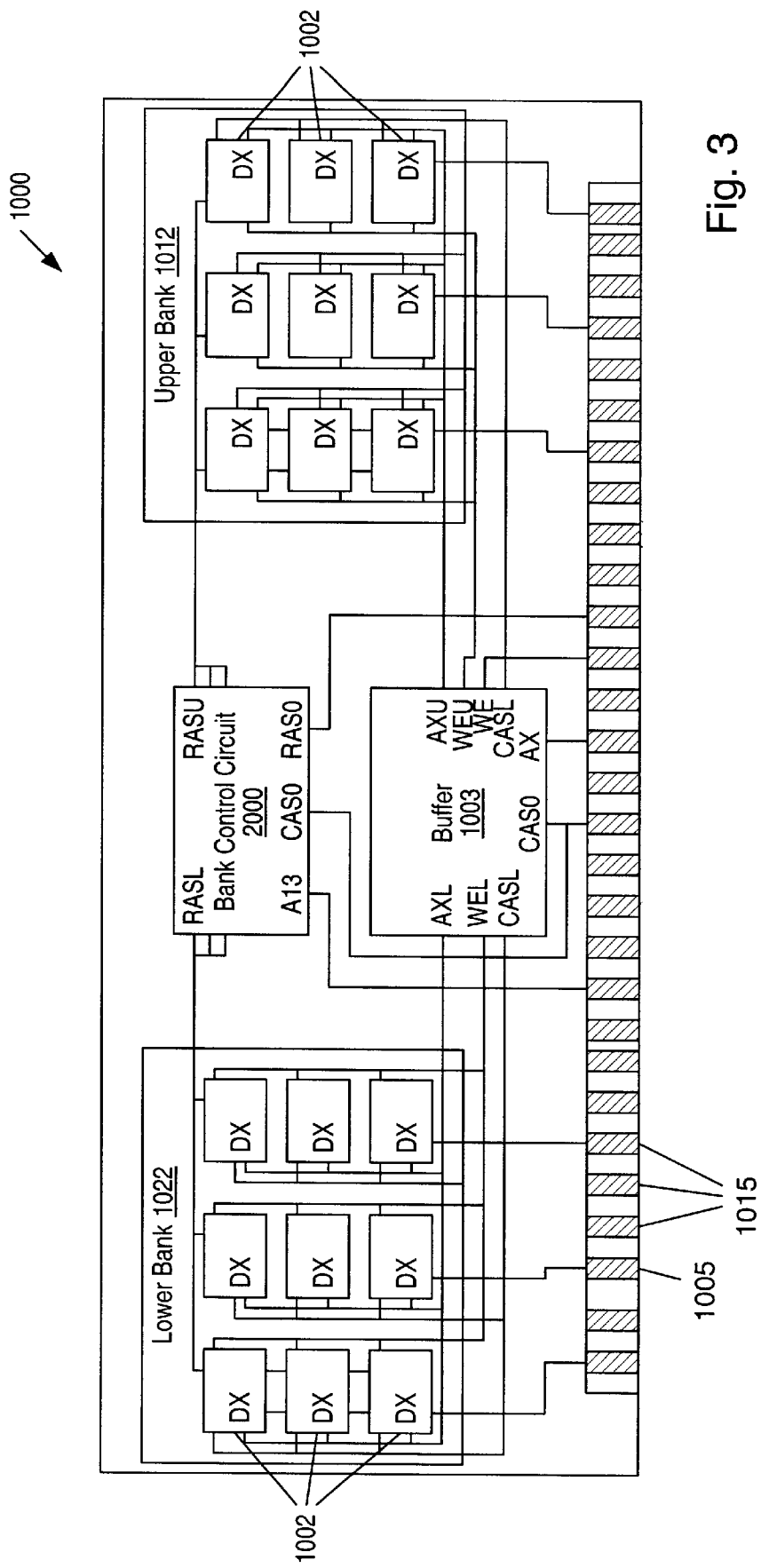
FIG. 3 is a block diagram illustrating the electrical connections associated with an embodiment of the memory module.

A block diagram illustrating the electrical connections associated with one embodiment of the memory module is shown in FIG. 3. Memory module 1000 includes an edge connector 1005, a lower memory bank 1022, and upper memory bank 1012, a bank control circuit 2000 and a buffer 1003. Each memory bank includes of a plurality of memory chips 1002. The edge connector 1005 includes a plurality of electrical contact pads 1015 which convey signals between the memory module and the system memory bus. Edge connector 1005 is adapted for mounting in a socket within a computer system. Buffer 1003 receives signals WE (write enable), CAS0 (Column Address Strobe 0), and a plurality of address signals, shown as AX. Buffer circuit 1003 drives a plurality of address signals AXL and AXU, which are conveyed to the lower memory bank 1022 and upper memory bank 1012, respectively. WEL and WEU are write enable signals driven by buffer 1003 to a lower memory bank 1022 and an upper memory bank 1012, respectively. CASL and CASU are CAS signals driven by buffer 1003 to the lower memory bank 1022 and upper memory bank 1012, respectively. The bank control circuit 2000 is configured to receive an address signal A13 for selecting the upper and lower bank. Address signal A13, in this embodiment, is the most significant address bit of an address bus that is 14 bits wide. Bank control circuit 2000 is also configured to receive a CAS0 signal and a RAS0 (Row Address Strobe 0) signal. A plurality of data lines, represented in the drawing as DX, convey data signals between the memory chips 1002 and system memory bus 104 of FIG. 1. In this particular embodiment, the data path is 144 bits wide.

FIG. 4A further illustrates an internal configuration of an embodiment of a buffer chip 1003. In the embodiment shown, buffer chip 1003 receives a plurality of address signals, A0–A12, a CAS0 signal, and a WE signal. The signals are passed through buffers 1013, generating corresponding signals that will be provided to an upper bank and a lower bank of memory chips. For example, the input signal WE produces two output signals, WEL and WEU for a lower and an upper bank of memory, respectively. The signals are split and buffered in this manner in order to provide sufficient signal strength for control and address inputs at the memory chips.

One embodiment of bank control circuit 2000 is shown in FIG. 4B. In this embodiment, bank control circuit 2000 receives input signals RAS0, CAS0, and address signal A13. Bank control circuit 2000 drives a plurality of RASLX and RASUX signals to the lower and upper memory banks, respectively. Depending on the combination of inputs received by bank control circuit 2000, either the RASUX or RASLX signal groups can be asserted exclusively for memory access operations. Another combination of inputs will assert all RASUX and RASLX signals in order to perform a CBR (Columns before Rows) refresh cycle.

The arrangement of the upper and lower memory banks in one embodiment of the memory module is illustrated in FIG.

4C. Each bank comprises a plurality of memory chips 1002. The memory chips are connected in such a manner as to form an upper bank 1012 and a lower bank 1022. The upper lower banks each include a plurality of memory chips 1002U and 1002L, respectively. Note that in the embodiment shown, the shaded memory chips are in the lower bank, while those that are shown as unshaded are part of the upper bank. Address, CAS, RAS, and WE signals exclusive to each bank are driven to each of memory chips 1002.

Figure 5:
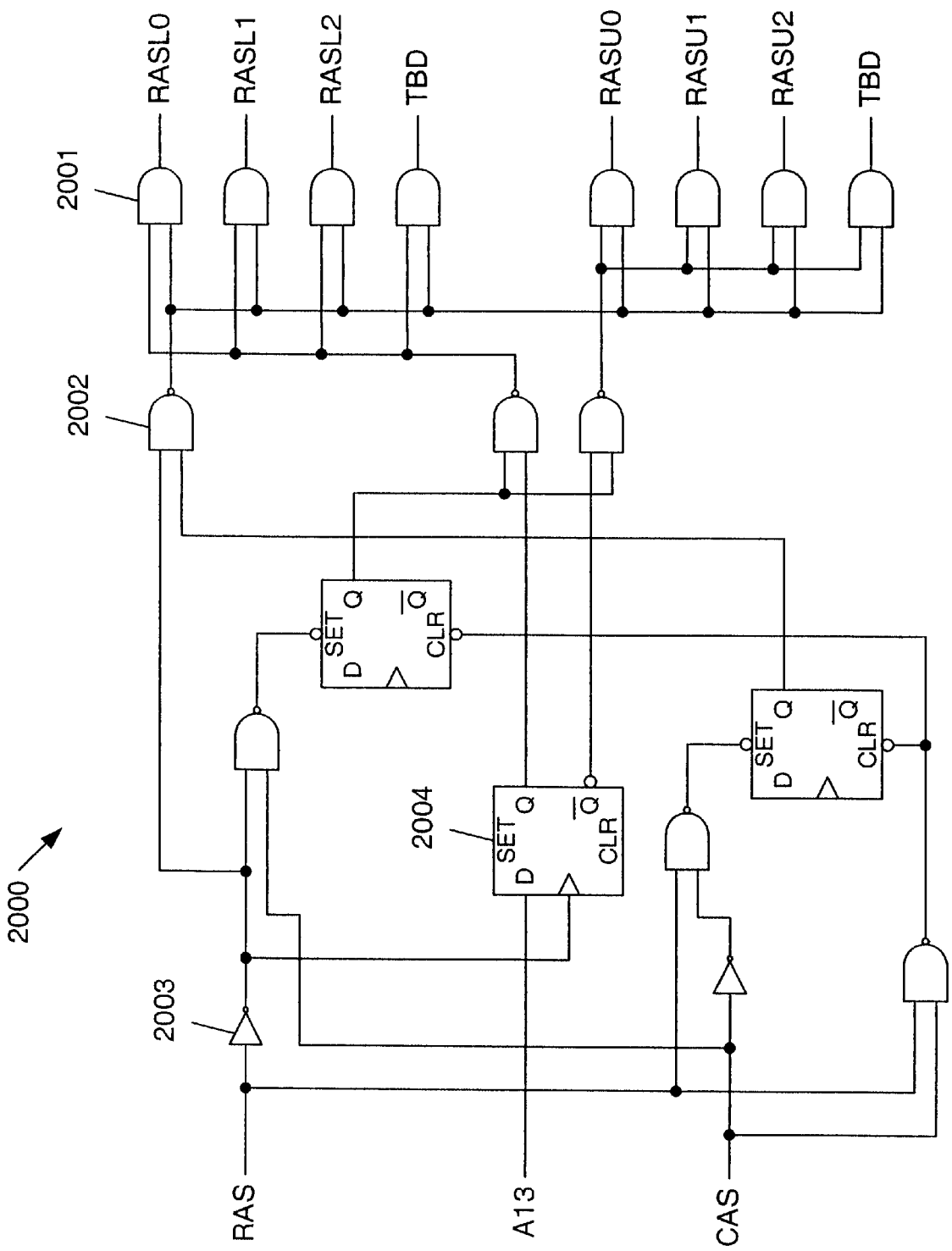
FIG. 5 is a schematic of a bank control circuit.

Turning now to FIG. 5, a schematic of one embodiment of the bank control circuit 2000 is shown. This particular embodiment of bank control circuit 2000 is a programmable logic device (PLD. In this embodiment, bank control circuit 2000 comprises a plurality of AND gates 2001, NAND gates 2002, inverters 2003, and flip-flops 2004 (D-type flip-flops in this embodiment). Bank control circuit 2000 drives multiple RAS signals for each memory bank in order to provide sufficient signal drive strength to each of the memory chips. The operation of the bank control circuit will be further illustrated in FIG. 6 and FIG. 7.

It should be noted that alternative embodiments of the bank control circuit are possible using other types of electronic circuitry.

FIG. 6 is a truth table 2501 that illustrates some of the state transitions that may occur in bank control circuit 2000 in one embodiment of the memory module. The first two rows of the truth table illustrate bank selection for memory access operations. Note that the logic levels are active low, i.e. considered asserted when logic 0, for this embodiment. In the first row of the truth table, a RAS signal is asserted, with A13 being a logic 0, causing the upper bank to be selected in the next state. Conversely, when A13 is a logic 1, the assertion of the RAS signal selects the lower bank in the next state. When a CAS signal is asserted before a RAS signal, as shown in row 6, all RASU and RASL signals are deasserted, and the system waits for the RAS signal to be asserted. When the RAS signal is asserted subsequent to the CAS signal, all RASU and RASL signals are driven low, and a CBR refresh cycle is performed.

Figure 7:
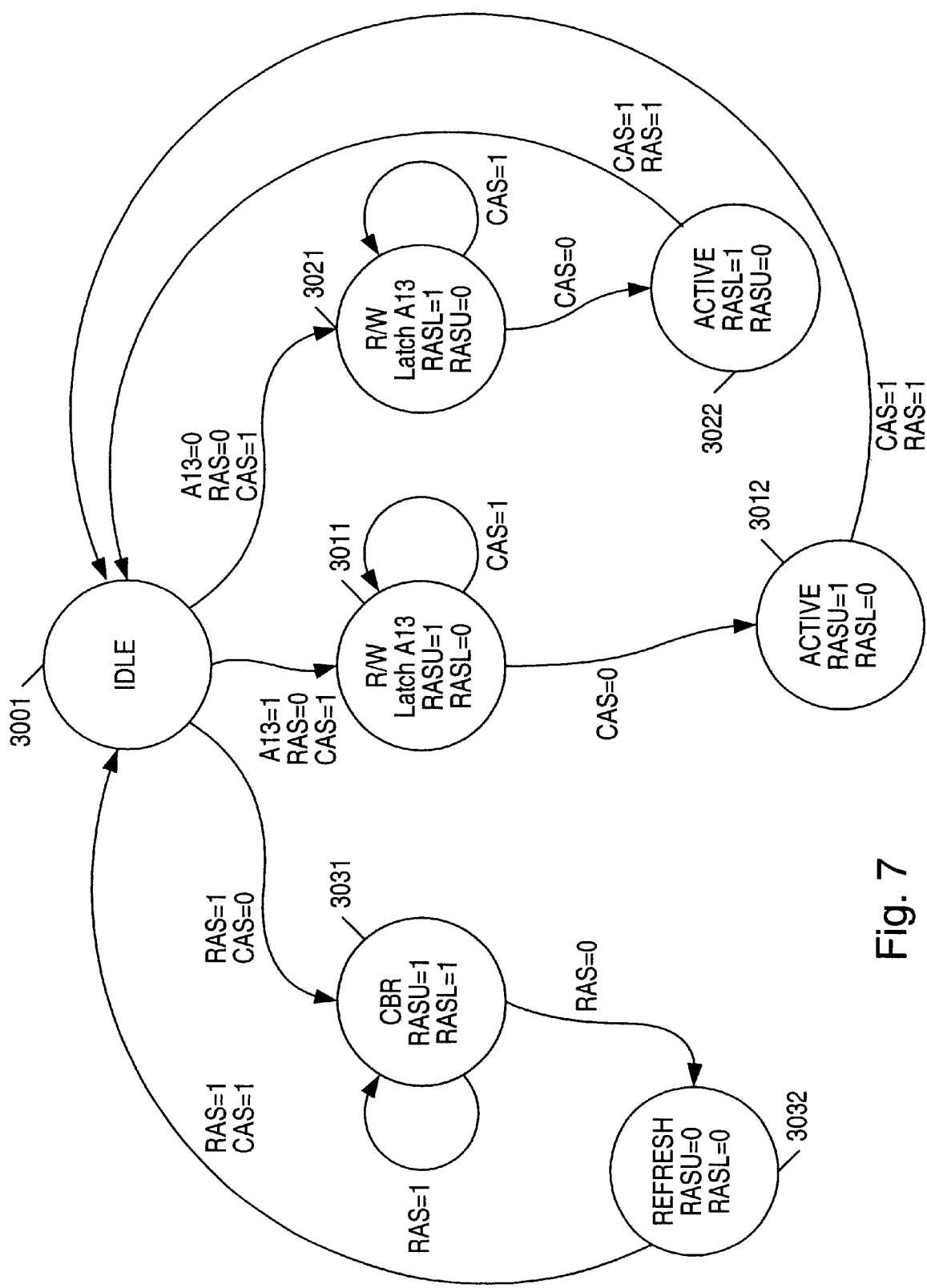
FIG. 7 is state diagram illustrating operations of one embodiment of the bank control circuit.

Operation of one embodiment of the bank control circuit is further illustrated with a state diagram in FIG. 7. When no memory access operations or refresh cycles are occurring, the bank control circuit is in an idle state 3001. When the bank control circuit receives an active low RAS signal, a memory access operation is initiated. Selection of the particular bank is dependent upon the state of address signal A13. For example, if A13 is a logic 0, the upper bank will be selected. The bank control circuit will transition to state 3021 and drive RASU signals to DRAM chips in the upper bank. When the DRAM chips of the upper bank receive the RAS signals, a row address is selected based on the address signals driven to them. When the active low CAS signal is asserted, the system will transition to state 3022, where a column address is selected. The data from the upper bank is then active. At the end of the memory cycle, both the CAS and RAS signals are deasserted, and the system returns to idle state 3001. The sequence is identical, with the exception of the state A13, for lower bank access.

A CBR refresh cycle will occur when a CAS signal is received before a RAS signal. When in idle state 3001, an active low CAS signal is received, the bank control circuit transitions to state 3031. All RASU and RASL signals will be deasserted in this state. When the bank control circuit receives an active low RAS signal, a transition to state 3032 will occur. At this state, all RASU and RASL signals are asserted, thereby selecting both banks of memory for the refresh operation. Following completion of the refresh, the RAS and CAS signals are deasserted, and the system returns to the idle state 3001.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory module comprising:

a printed circuit board including a connector edge adapted for insertion in a computer system;

a lower bank of memory chips mounted upon said printed circuit board;

an upper bank of memory chips mounted upon said printed circuit board;

a bank control circuit coupled to said upper and lower banks of memory chips, wherein said bank control circuit is configured to receive a row address strobe (RAS) signal and a column address strobe signal, and at least one address signal, wherein said bank control circuit is configured to selectively provide at least one corresponding RAS output signal to either said upper bank of memory chips or said lower bank of memory chips depending upon said address signal to thereby allow either said lower bank of memory chips or said upper bank of memory chips to be selectively accessed during a given memory operation;

wherein said bank control circuit includes a latch having a latch set input, wherein said bank control circuit further includes logic configured to assert a latch set signal that is provided to said latch set input in response to said CAS signal being asserted before said RAS signal, wherein assertion of the latch set signal causes an output of said latch to be set;

wherein said bank control circuit is configured to assert said corresponding RAS output signals concurrently to both said upper bank and said lower bank in response to an assertion of said RAS signal while said output of said latch is set; and a line driver chip, wherein said line driver chip is configured to drive electrical signals, and wherein said line driver chip is further configured to duplicate said electrical signals for driving to said upper bank of memory chips and said lower bank of memory chips.

2. The memory module as recited in claim 1, wherein said edge connector comprises a set of electrical contact pads for conveying said electrical signals.

3. The memory module as recited in claim 2, wherein said connector edge includes contact pads for receiving control signals, said control signals comprising at least one column address strobe (CAS) signal, at least one row address strobe (RAS) signal, and at least one write enable (WE) signal.

4. The memory module as recited in claim 3, wherein said electrical signals include address signals, and, wherein said address signals form an address bus, and, wherein said address bus is at least 14 bits wide.

5. The memory module as recited in claim 2, wherein said electrical signals include data signals, wherein data signals form a data path, and wherein said data path is at least 144 bits wide.

6. The memory module as recited in claim 1, wherein said bank control circuit is configured to provide as output a plurality of RAS Upper (RASU) signals and a plurality of RAS Lower (RASL) signals.

7. The memory module as recited in claim 6, wherein said RASU signals correspond to said upper bank of memory, and said RASL signals correspond to said lower bank of memory.

8. The memory module as recited in claim 7, wherein a unique combination of input signals to said bank control circuit will select said lower bank of memory for memory access operations by asserting said RASL output signals.

9. The memory module as recited in claim 8, wherein a unique combination of said input signals to said bank control circuit will select said upper bank of memory for memory access operations by asserting said RASU output signals.

10. The memory module as recited in claim 9, wherein said bank control circuit is configured to receive a Column Address Strobe (CAS) signal, and, wherein said bank control circuit is configured such that if said CAS signal is asserted before said RAS signal, both of said memory banks will be selected for a CBR (CAS before RAS) refresh cycle by asserting said RASL signals and said RASU signals.

11. The memory module as recited in claim 6, wherein said bank control circuit is a state machine, and wherein said CAS and RAS signals are used to toggle said bank control circuit through a predetermined sequence of states.

12. The memory module as recited in claim 1, wherein said memory module is a dual inline memory module (DIMM).

* * * * *